United States Patent [19]

Rouvrais

[11] Patent Number: 4,729,019
[45] Date of Patent: Mar. 1, 1988

[54] METHOD AND DEVICE FOR GENERATING IMAGES FROM ULTRASONIC SIGNALS OBTAINED BY ECHOGRAPHY

[75] Inventor: Bernard Rouvrais, Vezin le Coquet, France
[73] Assignee: CGR Ultrasonic, Villenoy les Meaux, France
[21] Appl. No.: 918,883
[22] Filed: Oct. 15, 1986
[30] Foreign Application Priority Data

Oct. 18, 1985 [FR] France .................. 85 15509

[51] Int. Cl.⁴ .............................................. H04N 5/213
[52] U.S. Cl. .................................... 358/112; 128/660; 358/96; 358/166; 358/167; 364/414; 382/6
[58] Field of Search ................. 358/112, 96, 166, 167; 382/6; 364/414; 128/653, 660, 661

[56] References Cited

U.S. PATENT DOCUMENTS

| | | | |
|---|---|---|---|
| 3,856,985 | 12/1974 | Yokoi | 358/112 |
| 4,386,528 | 6/1983 | Engle | 358/112 |
| 4,513,440 | 4/1985 | Delman | 382/30 |
| 4,538,227 | 8/1985 | Toraichi et al. | 364/414 |

FOREIGN PATENT DOCUMENTS

2089168 6/1982 United Kingdom .

OTHER PUBLICATIONS

Optical Engineering, vol. 20, No. 5, Sep./Oct. 1981, pp. 719-725, Bellingham, Wash., U.S.; E. G. Hawman: "Digital Boundary Detection Techniques for the Analysis of Gated Cardiac Scintigrams", *p. 719, the resume, pp. 720-724, section 3 entitled: Processing Structure*.
IEEE Transactions of Biomedical Engineering, vol. BME-27, No. 5, May 1980, pp. 249-254, IEEE, New York, U.S.; M. S. Hostetler et al: "A Microprocessor-Controlled Echocardiographic Tracking System", *p. 249, the resume; pp. 250-252, sections entitled: Instrument Design et Signal Processing*.
Acoustical Imaging, vol. 12, Proceedings of the International Symposium on Accoustical Imaging, Jul. 19-22, 1982, edited E. A. Ash et al., pp. 213-224, Plenum Press, New York, U.S.; R. J. Dickinson: "Reduction of Speckle in Ultrasound B-Scans by Digital Processing, *in its entirety*.
PRIP78—IEEE Computer Society Conference on Pattern Recognition and Image Processing, May 31-Jun. 2, 1978, Chicago, Ill., pp. 137-141, IEEE, New York, U.S.; P. M. Narendra: "A Separable Median Filter for Image Noise Smoothing", *in its entirety*.
ICASSP 84—IEEE International Conference on Acoustics, Speech, and Signal Processing, Mar. 19-21, 1984, San Diego, Calif., vol. 2, des 3, The Institute of Electrical and Electronics Engineers, Acoustics, Speech, and Signal Processing Society, pp. 20.11.1-20.11.2; G. R. Arce et al: "Median Filters: Analysis for 2 Dimensional Recursively Filtered Signals", *in its entirety*, and pp. 23.2.3-23.2.4; T. A. Nodes et al.: "Statistical Analysis of Two Dimensional Median Filtered Images", *in its entirety*.
IEEE Transactions on Acoustics, Speech, and Signal Processing, vol. ASSP-28, No. 6, Dec. 1980, pp. 725-733, IEEE, New York, U.S.; T. L. Marzetta: "Two-Dimensional Linear Prediction: Autocorrelation Arrays, Minimum-Phase Prediction Error Filters, and Reflection Coefficient Arrays", *in its entirety*.
Systems-Computers-Controls, vol. 14, No. 3, May--Jun. 1983, pp. 20-26, Scripta Publishing Co., Silver Spring, Md., U.S., Masayuki Nakajima et al: "Three-Dimensional Object Regeneration by Contour Curves with Color Data".

*Primary Examiner*—Howard W. Britton
*Attorney, Agent, or Firm*—Oblon, Fisher, Spivak, McClelland & Maier

[57] ABSTRACT

The method and the device provides for the automatic processing of digitalized signals in order to
remove speckle from the said signals by comparing the digitalized signal with a noise model obtained after learning its statistical properties,
extract, from the signals, echos not characteristic of the contour of the organ to be displayed,
extract the characteristic parameters of the contour from the said signals,
calculate the contour from these parameters by likening them to a pre-established model of variable parameters,
combine the digitalized signal, before or after eliminating noise, with the signal that is characteristic of the estimated position of the contour.
display the resultant signal in which the contour appears as an overlay.

14 Claims, 9 Drawing Figures

|   |   |   |   |   |   |
|---|---|---|---|---|---|
| 1 | 0 | 1 | 0 | 1 | 1 |
| 0 | 1 | 1 | 1 | 1 | 0 |
| 1 | 0 | 1 | 1 | 0 | 1 |
| 1 | 1 | 0 | 1 | 0 | 0 |
| 1 | 0 | 0 | 0 | 1 | 0 |
| 1 | 1 | 1 | 1 | 0 | 1 |

Fig. 4a

|   |   |   |   |   |   |
|---|---|---|---|---|---|
| 1 | ① | 1 | ① | 1 | 1 |
| 0 | 1 | 1 | 1 | 1 | 0 |
| 1 | ① | 1 | 1 | ① | 1 |
| 1 | 1 | ① | 1 | 0 | 0 |
| 1 | 0 | 0 | 0 | 1 | 0 |
| 1 | 1 | 1 | 1 | ① | 1 |

Fig. 4b

|   |   |   |   |   |   |
|---|---|---|---|---|---|
| 1 | 1 | 1 | 1 | 1 | 1 |
| ① | 1 | 1 | 1 | 1 | ① |
| 1 | 1 | 1 | 1 | 1 | 1 |
| 1 | 1 | 1 | 1 | ① | 0 |
| 1 | ① | ① | ① | 1 | 0 |
| 1 | 1 | 1 | 1 | 1 | 1 |

METHOD AND DEVICE FOR GENERATING IMAGES FROM ULTRASONIC SIGNALS OBTAINED BY ECHOGRAPHY

BACKGROUND OF THE INVENTION

1. Field of the Invention

The invention pertains to optical image formation for medical purposes using echography and, more especially, to a method for generating ultrasonic images, especially images of the heart, and to the device designed to use this method.

Echography is a method for the digital formation of optical images in real time, and has many applications. However, the quality and resolution of the images obtained are affected by interference from elementary diffusers which cause a granular noise known as "speckle". This speckle disturbs the visual quality of images obtained from the ultrasonic signals received. It is, therefore, necessary to reduce speckle by enhancing the contrast in the image. Besides, it can be made easier to use of images thus obtained by introducing an automatic procedure to detect the contours of an organ, an operation which is presently performed by the operator.

2. Description of the Prior Art

The processing of ultrasonic images is a little used method to date, despite the digitalization of the images obtained. In general, simple, recursive, mean-obtaining filters are used, and they only partly get rid of speckle. In cardiac echography, for example, significant parameters are obtained with manual contour detection.

The object of the present invention is an automatic method for generating images from ultrasonic signals obtained by echography, a method through which speckle is eliminated and which can also be used to estimate the contour of an organ by an automatic dynamic procedure and to display this contour in real time by an overlay the initial image or on the noise-cleansed image.

SUMMARY OF THE INVENTION

The invention pertains to a method for generating images from source ultrasonic signals obtained by echography, in which the echo signal is sampled and digitalized, to form a succession of samples $X_i{}^t,j$, with a coded digital luminance value of X at an instant t identified in the image by the row i of the horizontal column and the level j of the vertical column to which they belong, wherein the echographic signal is processed automatically to superimpose a contour of the analyzed organ on the image in the following way:

In an initial stage, the speckle present in the signal is reduced through filtration by generating a prediction divergence signal which expresses the useful information by means of the difference between the digitalized signal $X_{i,j}{}^t$ and a prediction signal calculated on the basis of a speckle model, this stage leading to the obtaining of a filtered digital signal $F_{i,j}{}^t$ and a binary signal $B_{i,j}{}^t$ deduced from this filtered signal, at 0 state for those pixels of the filtered signal having zero luminance and at 1 state for the other pixels;

In a second stage, the binary signal is processed for data corresponding to echos recognized as being not characteristic of the contour; this stage leads to a signal $I_{i,j}{}^t$ being obtained;

In a third stage, the signal $I_{i,j}$ is processed by bridging to minimize discontinuities by eliminating isolated pixels: the resultant bridged signal is then $\hat{I}_{i,j}{}^t$;

In a fourth stage, the bridged signal $\hat{I}_{i,j}{}^t$ is processed to extract the parameters from it that can be used in a model of the contour of the examined organ. This processing is done on a zone with a maximum area, known as a zero density zone, comprising only zeros and corresponding to the interior of the analyzed organ;

In a fifth zone, the contour points are computed on the basis of the characteric parameters extracted and the equation of the model of the organ;

In a final stage, the digital signal, before filtering, is replaced by an overlay signal for all the points of the contour, the resultant combined digital signal being then displayed.

The object of the invention is also the device designed to use this method.

BRIEF DESCRIPTION OF THE DRAWINGS

The invention will be better understood and other of its characteristics will emerge from the following description made with reference to the appended figures, wherein.

DESCRIPTION OF THE PREFERRED EMBODIMENT

The method for generating ultrasonic images according to the invention can be used to overlay a contour with a false colour. For heart images, the estimated cardiac contour and the mitre valve for a section through the small axis of the heart are displayed after eliminating the speckle at the source image. In this method, the contour is estimated dynamically, the method being used for the automatic extraction of parameters of clinical interest such as the diastole (maximum of relaxation) and the systole (minimum of contraction) for the heart images.

The following specific description is given for heart images but is not limited to them.

The first stage of the method for generating ultrasonic images according to the invention is a spatial preliminary processing stage, the purpose of which is to reduce speckle by learning its statistical properties. The second stage consists in extracting the part corresponding to the mitre valve from the image, this extraction being done by a study of movement in a sequential manner. This stage is indispensable for the easy detection of the cardiac contour which can be likened to an ellipse of variable parameters. The third stage, then, consists in the automatic estimation of the cardiac contour. During this stage, it is also possible to extract the characteristic parameters automatically. The final stage of the method consists in overlaying a contour, corresponding to the estimated contour, on the image.

The various stages of the method, which have been concisely summarized above, are described in detail below in relation with the detailed description of the device for generating ultrasonic cardiac images according to the associated invention.

The conventional technique of echography can be used to obtain a digital data signal by sampling the echos signal at a sampling frequency $F_e$, 6.75 MHz for example, giving 351 pixels per effective TV scanning line (1 TV line of 64 microseconds comprising 52 useful microseconds and 12 microseconds of line suppression interval); with 512 lines per image, the maximum number of pixels per image is in the region of 180,000. The ultrasonic cardiac image occupies only a third of a television image. Consequently, the image can be masked to increase processing time between pixels of two successive images; the reduction by masking of the TV image to a third gives 60,000 pixels per image to be processed in 40 ms, the duration of an image, i.e. 666 nanoseconds per sample. This duration is sufficient for the real-time processing of samples according to the invention, provided that a sufficient delay is allowed for.

Let $X_{i,j}^t$ be the input signal at the instant t indexed by row i of the horizontal column and the row j of the vertical column, identified in the image to which this input signal corresponds. This signal is a digital signal corresponding to the quantification of the signal received on one of the 256 levels. As indicated above, the first processing operation is one of filtering to eliminate noise so as to reduce the speckle in the image. This filtering gives a filtered digital signal $F_{i,j}^t$, and a binary signal $B_{i,j}^t$ characteristic of the luminance of the image; the logic level 1 is assigned to the pixels of non-zero luminance while the logic level 0 is assigned to the pixels of zero luminance in the filtered image signal F.

The next stage corresponds to the phase in which the mitre valve's parameters are extracted, i.e. the stage of extraction of pixels in periodical movement (the mitre valve is the orifice that enables blood to flow from the auricle to the ventricle). This extraction is an indispensable stage in detecting the contour of the heart cavity. The extraction method uses the fact that this valve is in periodical movement: during a cardiac cycle, the mitre valve changes position and direction; at the instant $t_o$, the valve is in a position $P_o$, at the instant t the valve is in a position P. The algorithm used to extract the parameters of the mitre valve will be efficient if this valve is not confused with the cardiac contour, i.e. if its farthest compared positions are totally disjointed.

After this valve extraction stage, the image $I_{i,j}^t$ cannot be exploited directly even though the zone corresponding to the movement of the mitre valve has been extracted, for the contour remains far too discontinuous. The method according to the invention is therefore, used to complement this mitre valve extraction stage by a bridging of the binary image which is done in horizontal and then vertical columns so that the pixels having logic levels 0 are always contiguous along a distance of greater than 1 pixel; i.e. a pixel cannot remain in the state 0 if its neighbours in the horizontal column and then in the vertical one are in the state 1.

Once this bridging is done, the next stage of the processing method then aims at seeking the maximum zone of zero density. This zone corresponds to the heart cavity. This density is defined as the number of logic levels at state 1 in a square of given dimensions.

This processing is used to determine the coordinates of the centre of the mass of the heart cavity and to take a contour through all four vertices of the zero density square thus determined. It transpires that a correct approximation of the cardiac contour is given by an ellipse. The ellipse is therefore, determined from this square. The processing algorithm needed will be described in detail below in connection with the precise description of the means for extracting the parameters of the contour and of the contour-calculating circuit.

The final processing stage consists then in overlaying the contour thus defined on the image in such a way as to help the operator in his analysis of the image, i.e. in superimposing, on the initial or noise-cleansed image, a coloured line which gives shape to the contour of the heart cavity in the image.

Figure 1:
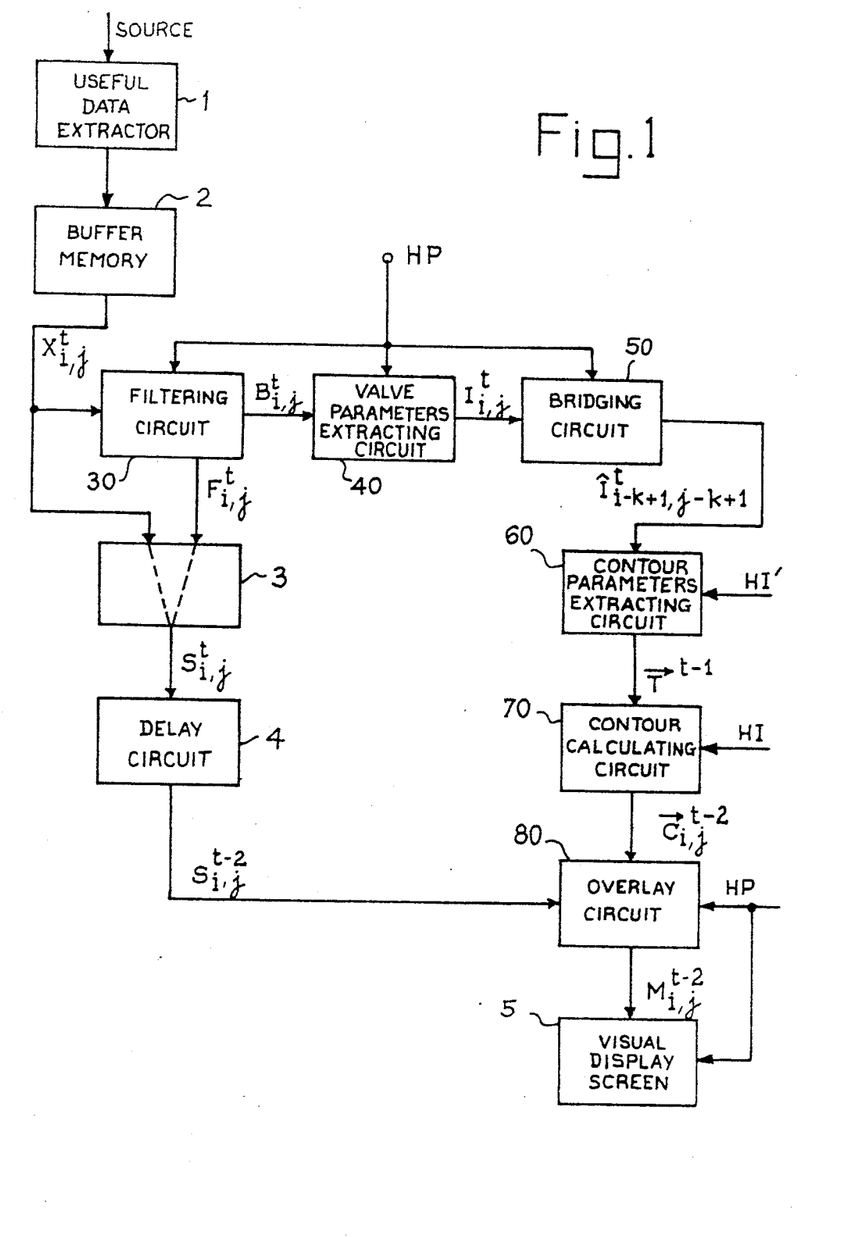
FIG. 1 is a block diagram of the image-generating device according to the invention.

FIG. 1 is the general block diagram of the device for generating heart images according to the invention. The means needed for echographical analysis and signal reception are not depicted in this figure which includes only the device for processing the signal received by the ultrasonic signal transmitter/receiver pick-up. The source signal from the pick-up in reception is characteristic of the variable intensity echos received, with the intensity depending on the type of tissue and structure encountered. This reception signal is applied to a circuit 1, a useful data extractor, which comprises conventional means for analog signal processing, amplification, filtering etc. and an analog-to-digital converter used to quantify the analog signal at 256 levels for example. To exploit this signal, a frame-scanning signal is generated to control a cathode screen of a visual display unit 5, synchronized with the echographical scanning of the heart by the narrow beam which scans a sector and defines the scanning plane. The beam is made up of a train of ultrasonic pulses. The repeating frequency of the pulse transmitter is chosen, as is known in the prior art, in such a way that a transmitted pulse has enough time to reach its target and return before the departure of the following pulse.

The signal from the useful data-extracting circuit 1 is applied to the input of a buffer memory 2 which gives the digital signal $X_{i,j}^t$ corresponding to the echos received. This signal should be expressed by a luminance signal on the cathode display screen 5. This sequence $X_{i,j}^t$ is applied (a) to the display unit 5 by a direct channel comprising, in a series, a switch 3, a delaying circuit 4 and an overlay circuit 80 and (b) to the input of a processing channel comprising a filtering circuit 30 which shall be described in detail below with reference to FIG. 2. This filtering circuit provides, firstly, a filtered signal $F_{i,j}^t$ applied to the second input of the switch 3 and, secondly, a binary signal $B_{i,j}^t$ useful for extracting the parameters of the mitre valve and then for calculating the contour. This binary signal is applied to the input of a circuit for extracting the mitre valve 40, described below with reference to FIG. 3 which gives an intersection signal $I_{i,j}^t$. This intersection signal, which is characteristic of the non-moving parts detected, i.e. especially of the contour, is applied to the input of a bridging circuit 50, the functioning of which is described below with reference to FIGS. 4a, 4b and 4c, and the output of which is connected to the input of a circuit 60 for extracting the parameters of the contour. This circuit 60 is connected to the input of a contour-calculating circuit 70.

The output of the delaying circuit 4 which gives either the digital signal from the buffer memory 2 or the filtered signal from the filtering circuit 30, depending on the position of the switch 3, is connected to the input of the visual display unit 5 by means of the overlay circuit 80 which also receives the contour signal. This overlay circuit is used to replace the parts corresponding to the calculated contour in the digital image signal by a predetermined signal corresponding to a characteristic colour.

The filtering circuit 30, the valve parameters extracting circuit 40 and the bridging circuit 50 work at point frequency in real time and are synchronized by the point clock signal HP. In contrast the circuit for extracting the parameters of the contour and the circuit for calculating the contour work at the image frequency and are synchronized by clock signals H1 for the contour calculating circuit and H1' for the circuit to extract the parameters of the contour at the image frequency, H1' being the image clock H1 shifted by a duration that corresponds to $k-h$ horizontal columns and $k-h$ vertical columns. The overlay circuit 80 and the visual display cathode screen 5 are, of course, synchronized at the point clock frequency HP. In view of the delay needed to extract the parameters of the contour (one image) and to calculate the contour (another image), the delay introduced by the delaying circuit 4 into the direct channel that transmits the digital image, before or after filtration depending on the position of the switch 3, is a two-image delaying circuit.

Figure 2:
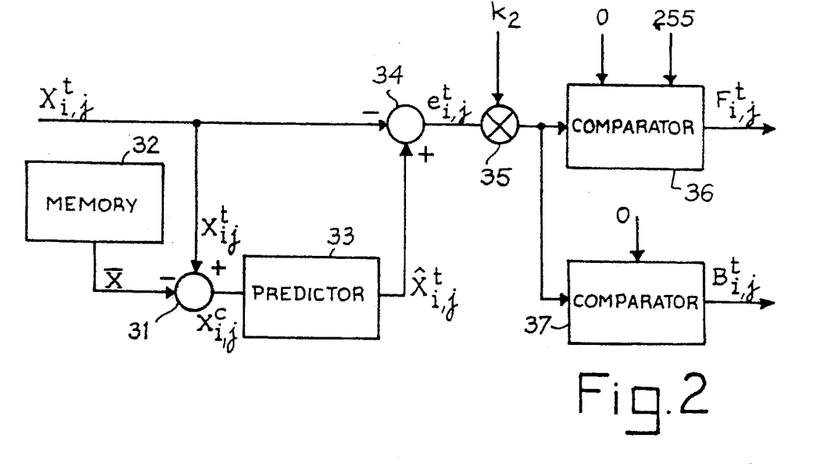
FIG. 2 is a detailed diagram of the filtering circuit 30 of the FIG. 1.

FIG. 2 represents the filtering circuit 30 of FIG. 1. As indicated above, the filtering process uses the statistical properties of the noise or speckle in order to reduce it. For a model of the noise is obtained by learning the statistical properties of one zone of the image; the mean $\overline{X}$. the variance E ($E_n$ at the stage n) of the preduction divergence and the self-correlation function r(m) are estimated in a sequence of preliminary images of a ventricle where the graininess of the grey in the image can be identified with speckle.

After this, the difference between the noise model and the source image gives, for each pixel, a datum called a prediction divergence $e_{i,j}$. Thus, in the zones of noise alone, the prediction divergence $e_{i,j}$ is small while, in the so-called contour zones, the prediction divergence is great. This is a way of analyzing the non-stationary behaviour of the level of grey in the image by detecting all sudden changes of luminance in the image. This system is used to reduce the noise while preserving the organization of the useful data of the source image.

To prepare the model, the noise is compared to a "circular" noise, i.e. a noise that has the same statistical properties in all directions. This hypothesis permits the calculation of the self-correlating function of a number N of neighbouring points distributed in a window along a horizontal column row i and vertical column row j, at a distance m from the central point of this window, i.e. r(m) this function. The numerical values $X_{i,j}$ are centered with respect to the mean $\overline{X}$. Given an instant t, the centered value $X_{i,j}{}^c = X_{i,j} - \overline{X}$.

The self-correlating function can then be calculated simply by the formula:

$$r(m) = \frac{1}{2N} \sum_{i,j} X^c_{i,j}(X^c_{i,j+m} + X^c_{i+m,j})$$

The results obtained by the calculation of this self-correlating function show that speckle is correlated and, therefore, predictable. It is reduced by minimizing prediction error through the identification of a model of the one-dimensional self-regressive type. The direction chosen is that of the echos.

The predictor calculates the sequence of the prediction values $C_{i,j}$ on the basis of the preceding numerical values p, in this direction, i.e. $\hat{X}_{i-m,j}{}^c = m-1$ at p in the following way:

$$\hat{X}_{i,j} = k_1 \sum_{m=1}^{p} a_m X^c_{i-m,j}$$

It is assumed in this formula that the direction of the echos coincides with the lines of the image; $k_1$ is a predetermined coefficient used to accentuate the elimination of speckle and the p coefficients $a_m$, of m=1 to p are coefficients of the noise model, obtained prior to any processing by analysing a series of images, measuring the self-correlating function of the noise and resolving the following system of linear equations:

$$r(m) = - \sum_{k=1}^{p} a_k r(m-k),$$

for m=1 to p.

Several methods can be used to resolve this system of linear equations, for example, those using the so-called "Durbin" or "Levinson" methods as described in the IEEE journal, "Proceedings of the IEEE" Vol. 63, No. 4, April 1975, in an article entitled "Linear Prediction: A Tutorial Review" (especially pages 565 and 566).

In the present application, i.e the analysis of ultrasonic images of the heart, the coefficients $a_k$ determined for the model tend towards zero and the variance of the prediction error is stabilized approximately above 3. Hence, p is chosen as being equal to 3 and the analysis of a series of images results in the following coefficients:

$a_1 = 0.4235$ $a_2 = 0.1446$ $a_3 = 0.1232$ and an estimated mean noise: $\overline{X} = 21.1453$. The filtered signal $F_{i,j}$ is then obtained in the following way:

$$F_{i,j} = k_2(\hat{X}_{i,j} - X_{i,j})$$

$k_2$ being an coefficient used to increase the range of useful data, after the negative values $(\hat{X}_{i,j} - X_{i,j})$ have been replaced by the luminance value 0 and after the values $k_2 (\hat{X}_{i,j} - X_{i,j})$, greater than the maximum luminance value (which is 255 for a luminance coding on 8 bits of 0 to 255), have been replaced by this maximum value.

The filtering circuit 30 which performs this processing and which is depicted in FIG. 2 thus comprises a subtracter 31, with an input connected to the input of the circuit, receiving the sequence of digital values $X_{i,j}$, and an input receiving the mean of the noise $\overline{X}$ previously calculated and stored in a memory 32. The output of the subtracter 31 is linked to the input of a predictor 33 which calculates, for each $X_{i,j}{}^c$, the value of the prediction $$\hat{X}_{i,j} = k_1 \sum_{m=1}^{p} a_m X^c_{i-m,j}.$$

To this end, the predictor comprises, in a manner known in the art, p+1 memories giving four memories for the case specifically described above, containing the p values previously centred, $X_{i-m_i}{}^c$ and, after the calculation, the prediction $\hat{X}_{i,j}$. A multiplying and then an adding circuit is used to make the prediction calculation. The output of the predictor 33 is linked to the input of a subtracter 34, the second input of which is linked to the input of the circuit and gives the prediction divergence:

$$e_{i,j}{}^t = X_{i,j}{}^t - \hat{X}_{i,j}{}^t.$$

It must be noted that the prediction value $\hat{X}_{i,j}$, obtained from the centered values is diminished, directly, by the non-centreed digital value in the line $X_{i,j}$, an operation that reduces the noise-charged parts of the image to the level of zero luminance. The output of the subtracter 34 is linked to the input of a multiplier by $k_2$, 35, the output of which is itself linked to the input of a comparator 36 with two reference values, 0 and 255, this comparator reducing negative values to 0 and values greater than 255 to 255. The filtered signal $F_{i,j}{}^t$ at the output of the comparator 36 thus has values belonging to the dynamics of the luminance (0.255). The output of the multiplier 35 is also linked to the input of a second comparator 37 which has a reference value 0 and delivers the binary signal $B_{i,j}{}^t$ of level 0 for negative or zero values of $e_{i,j}{}^t$ and of level 1 for the other values.

Figure 3:
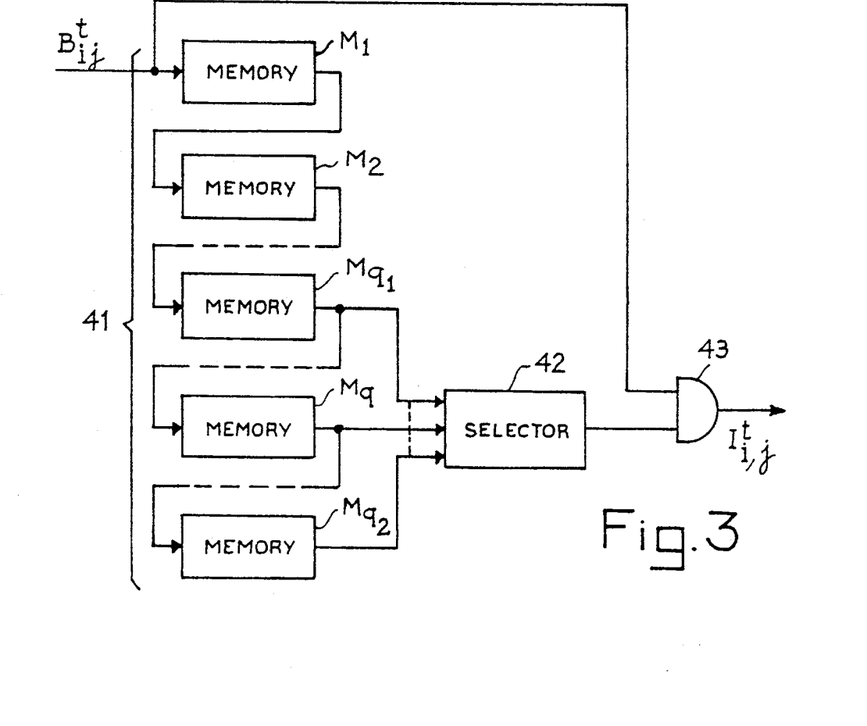
FIG. 3 is a detailed diagram of the circuit for extracting the image of the mitre valve 40 of FIG. 1.

The next step of the processing consists, as indicated above, in extracting the data on the mitre valve from the binary signal $B_{i,j}{}^t$. Owing to the method of echographical analysis itself, the processed image corresponds to a section along the small axis of the heart. The mitre valve generates echos which do not signify the contour of the heart and the corresponding data must therefore be extracted.

To extract this data, the intersection signal, $I_{i,j}{}^t$, the result of the logic AND operation between the values of the binary signal $B_{i,j}$ at two instants $t_o$ and $t$ corresponding to the farthest positions of the mitre valve is calculated as follows:

$$I_{i,j}{}^t = B_{i,j}{}^{t_o} \text{ AND } B_{i,j}{}^t.$$

The entire image zone in which the intersection signal $I_{i,j}{}^t$ has the logic 1 level corresponds, on the one hand, to the cardiac contour and (b) to the intersection points, if any, between the two positions of the mitre valve at the instants t and $t_o$. This processing will be all the more efficient as all the interior points of the heart cavity will be in the image at the logic 0 level. For this, taking into account the rhythm of analysis and the resultant image rhythm, the cardiac rhythm is such that 7 successive images, on an average, initially separate the two image binary signals $B^{t_o}$ and $B^{t=t_o+7T_i}$ in calculating the intersection signal. But the method according to the invention provides for for estimating the movement of the valve by a speed vector so as to readjust, if necessary, the number of images that separate the farthest positions of the valve.

The circuit 40, designed to make this calculation comprises, a set 41 of q2 series-connected memories, $M_1, M_2 \ldots M_{q1} \ldots M_q \ldots M_{q2}$, q1 and q2 being the minimum ad maximum number of images capable of separating the two farthest positions of the mitre valve. The memories are shift registers which correspond to the delays $T_i$ of an image period, i.e. image memories with one binary element per pixel. At an instant t, the signal $B_{i,j}{}^t$ is applied to the input of the memory $M_1$, $B_{i,j}{}^{t-T_i}$ is applied to the input of $M_2$ etc., the output signal of $M_q$ being $B_{i,j}{}^{t-qT_i}$. The outputs of the memories $M_{q1}$ to $M_{q2}$ are connected to te inputs of a selector 42 which transmits the output signal of one of the memories $M_{q1}$ to $M_{q2}$, $M_q$, to its output, depending on the cardiac rhythm of the patient for whom this analysis is being made. The input of the memory $M_1$ and the output of the selector 42 are connected to the inputs of an AND gate 43 which gives the intersection signal $I_{i,j}{}^t$. For all the pixels inside the heart cavity, the signal $I_{i,j}{}^t$ should be nil. In reality, as indicated above, despite the prior filtering of noise and the removal of echoes associated with the mitre valve, the signal $I_{i,j}{}^t$ is even more difficult to exploit for a simple extraction of useful data relating to the heart contour.

Figure 4A:
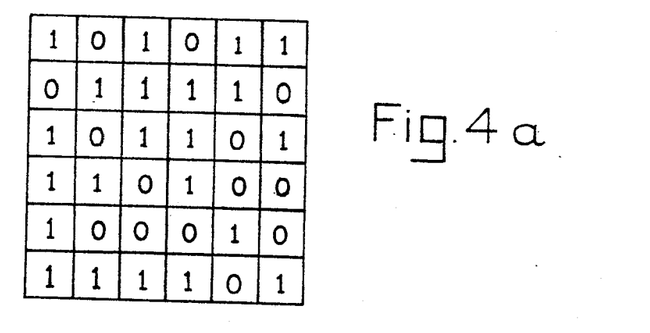
FIGS. 4a, 4b and 4c depict the bridging method used in the logic circuit 50 of FIG. 1.
Figure 4B:
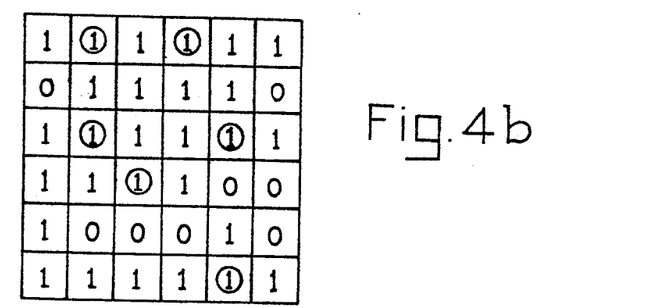
Figure 4C:
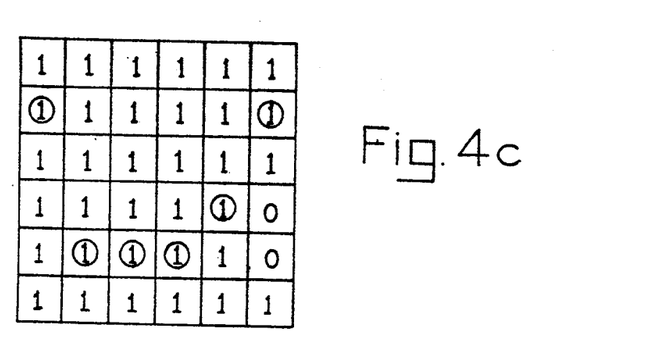

The bridging circuit 50 performs the additional processing described above to eliminate the "isolated" points at the logic 0 level, i.e. those points that are not continuous along a distance equal to at least L points. The bridging is done, for example, first by horizontal column and then be vertical column. The resultant signal is $\hat{I}_{i,j}$. For this, the briding circuit 50 transmits all the points at the logic 1 state without modification and puts all the points at the logic 0 at the logic 1 level when, in a horizontal or vertical column to which they belong, the farthest points that surround them, along a distance L, are also at the state 1. The logic operations performed are the following.

(1) If $I_{i,j} = 1$ then $\hat{I}_{i,j} = 1$.

(2) For the line bridging, if for a value $n \leq L$ $$I_{i-n,j} = 1 \text{ and } I_{i,j} = 1 \text{ then } \hat{I}_{i-n+1,j} = 1$$

$$\frac{I_{i-n+2,j} = 1}{I_{i-1,j} = 1}$$

(3) For the column bridging, on the basis of the preceding results, if there is a value $n \leq L$ such that $$I_{i,j-n} = 1 \text{ and } I_{i,j} = 1 \text{ then } \hat{I}_{i,j-n+1} = 1$$

$$\frac{\hat{I}_{i,j-n+2} = 1}{\hat{I}_{i,j-1} = 1}$$

The example shown in FIGS. 4a, 4b and 4c illustrates the bridging method for L=2. The FIG. 4a shows an example of a binary image $I_{i,j}{}^t$ before bridging, the FIG. 4b shows the same image after horizontal columnwise bridging and the FIG. 4c the same image after vertical columnwise bridging. This example clearly shows how the "isolated" 0 are eliminated. If the objective is not to keep the groups of two contiguous 0, then L is chosen as being equal to 3. The corresponding logic circuit 50 is within the scope of the expert and comprises only AND and OR logic gates.

Figure 5:
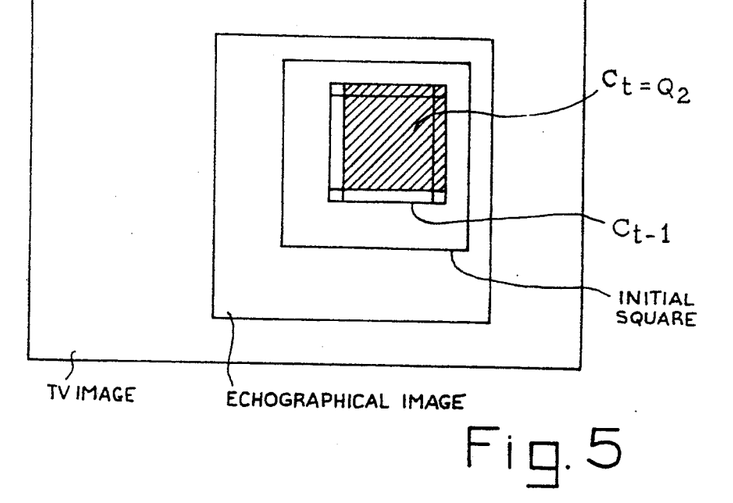
FIGS. 5 and 6 illustrate the method for seeking the maximum square of zero density to extract the parameters of the contour.
Figure 6:
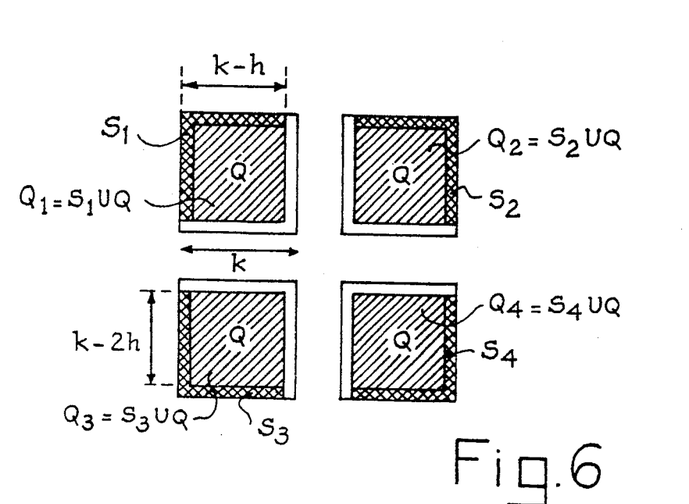

The resultant signal is then processed in the circuit 60 so that the parameters of the contour are extracted from it. For this, as indicated above, an automatic search is made for the maximum square of zero density. At the outset, a square zone is defined as a basis. This zone has the image of the heart in definite way. This zone with dimensions k×k is then subdivided into four squares $Q_1$, $Q_2$, $Q_3$ and $Q_4$ with dimensions (k−h)×(k−h), partially overlapping, in a zone Q. The densities of these four squares are then compared and the square of minimum density $C_t$ is then set aside to act as a basis for a fresh subdivision and a fresh comparison until a zero density square is found. FIGS. 5 and 6 give a schematic depiction of the zones mentioned above at one instant in the processing operation. The quickest way to compare the four zones, $Q_1$, $Q_2$, $Q_3$ and $Q_4$ is to compare only the densities in the zones $S_1$, $S_2$, $S_3$ and $S_4$ complementary of Q, to arrive at $Q_1 \ldots Q_4$ respectively: the square of minimum density and of dimensions $(k-h) \times (k \times h)$ is defined as:

$$c_t^{k-h} = \{\min(S_1, S_2, S_3, S_4)\} \cup Q.$$

This square is obtained by making a comparison at each stage of the convergence, at the point $$\sum_{i,j} I_{i,j}$$

rhythm on fractions of horizontal columns with a length $k-h$ and fractions of vertical columns with a length $k-h$, and by adding the density of the square $h \times h$ forming the vertex.

In a mode of embodiment, h is taken as being equal to 1.

$$\begin{cases} S_1 = c_l + r_l + I_{l,l} \\ S_2 = r_l + c_k + I_{l,k} \\ S_3 = c_l + r_k + I_{k,l} \\ S_4 = c_k + r_k + I_{k,k} \end{cases}$$

With $$c_l = \sum_{i=2}^{k-1} I_{i,l} \; c_k = \sum_{i=2}^{k-1} I_{i,k} \; r_l = \sum_{j=2}^{k-1} I_{l,j} \text{ et } r_k = \sum_{j=2}^{k-1} I_{k,j}$$

Figure 7:
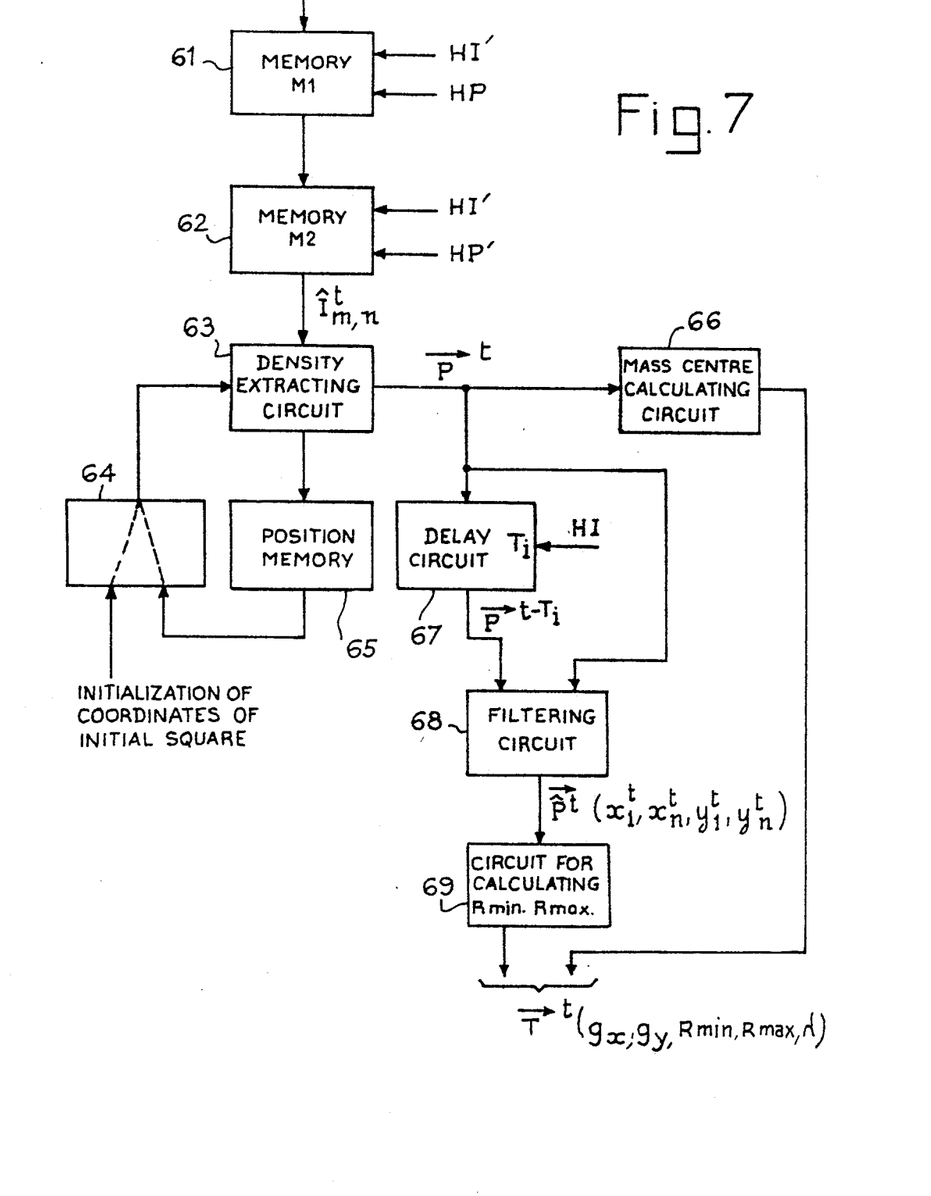
FIG. 7 is a diagram of the circuit for extracting the parameters of the contour 60 of FIG. 1.

The extraction circuit of the parameters of the contour is depicted in FIG. 7. It comprises a buffer memory 61 in which the reading and writing are respectively done by the point clock HP and the image clock HI' shifted by $(k-h)$ horizontal columns and $(k-h)$ vertical columns with respect to the image clock HI. The output of this memory is linked to the input of a second memory 62 in which the writing and the reading are respectively done by the clock HI' and by the clock HP' which is, if necessary, faster than HP. The output of the memory 62 is linked to the input of the density-extracting circuit 63 which calculates the density of the square at each stage of the convergence as indicated above. This circuit initially receives the coordinates of the initial square via the first input and the output of a switch 64 and then, during the process, receives the coordinates of the square to be considered for the following stage. These coordinates are given by a position memory 65 which receives them from the extracting circuit 63 (after the test on the densities of the four squares resulting from the subdivision) and transmits through the second input and the output of the switch 64. At a given stage, the coordinates of the vertices of the minimum density square are $(x_1, y_1)$, $(x_1, Y_n)$, $(x_n, y_1)$ and $(x_n, y_n)$. At each stage, the density extracting circuit 63 gives the vector of the corresponding position defined by these four coordinates.

$\vec{P}(x_1, x_n, y_1, y_n)$.

When the density measured is zero, at $t_o$, the position vector is $\vec{P_o}(x_1^{t_o}, x_n^{t_o}, y_1^{t_o}, y_n^{t_o})$. A circuit 66 then calculates the coordinates of the mass centre G $(g_x, g_y)$ and the corresponding radius R.

The coordinates of the mass centre are $$g_x = \frac{x_1^{t_o} + x_n^{t_o}}{2} \text{ and } g_y = \frac{y_1^{t_o} + y_n^{t_o}}{2},$$

and the circle that passes through these four vertices has the mass centre for its centre and R for its radius such that $$R^2 = \frac{(y_n^{t_o} - y_1^{t_o})^2}{2}.$$

As indicated above, a correct approximation of the contour of the heart is an ellipse of the equation:

$$\lambda^2(x-g_x)^2 + y - g_y)^2 = R^2,$$

where $\lambda$ is a variable coefficient, close to 1, equal to or greater than a minimum value $\lambda_{min}$, which enables a precise adjustment of the contour in time. Thus, during the analysis of a sequence of images, $\lambda$ is first of all, taken to be equal to a minimum value $\lambda_{min}$, chosen for example, as being equal to 0.85, then this value is adjusted. To ensure the sequential follow-up of the contour, a test is made: for two successive images at $t_o$ and $t_1$, the coordinates of the zero density square should not diverge by more than two pixels.

Let:

$$|x_1^{t_o} - x_1^{t_1}| \leq 2, \; |y_1^{t_o} - y_1^{t_1}| \leq 2, \; |x_n^{t_o} - x_n^{t_1}| \leq 2$$
$$et \; |Y_n^{t_o} - y_n^{t_1}| \leq 2.$$

If an excess is detected, the retained coordinate is the initial coordinate $t_o$, give or take 2, along the direction of the shift. The sequential follow-up gives the direction in which ellipse has its big axis. For since $\vec{P_o}$ is the position vector at the instant $t_o$ and $\vec{P_1}$ is the position vector at the instant $t_1$: a current position vector P is obtained by comparing the positions of the squares at these two successive instants.

For this, a one-image delaying circuit 67 receives the position vector associated with an image $\vec{P^t}$, from the density-extracting circuit, and gives the position vector associated with the preceding image $\vec{P^{t-T_1}}$. A filtering circuit 68 has two inputs linked to the input and the output of the delaying circuit 67, and gives a current position vector $\hat{P}$ at an instant t as a function of the divergence tolerated on the coordinates $(x_1, x_n, y_1, y_n)$ between the position vector at the instant t, $\vec{P^t}$, and the preceding position vector $\vec{P^{t-T_1}}$.

The coordinates retained for the filtered position vector $^t(x_1^t, x_n^t, y_1^t, y_n^t)$ are applied to a circuit for calculating the coefficient $\lambda$, 69.

The value of $\lambda$ is given by:

$$\lambda = \frac{y_n^t - y_1^t}{x_n^t - x_1^t} \times \lambda_{min}$$

In practice, the contour which will be overlaid has a thickness obtained by calculating a minimum value $R_{min}$ and a maximum value $R_{max}$ for the radius R, as a function of the coordinates $y_1$ and $y_n$ as follows:

$$\begin{cases} R_{min}^2 = \dfrac{(y_n - y_1 - 1)^2}{2} \\ R_{max}^2 = \dfrac{(y_n - y_1 + 1)^2}{2} \end{cases}$$

The coordinates of the mass centre $G(g_x, g_y)$ given by the circuit 66, and the coefficient $\lambda$ and the radii $R_{min}$ and $R_{max}$ given by the calculating circuit 69 form a vector $T^t$, at each image, which can be used to calculate the heart contour which is likened to an ellipse.

The contour calculating circuit 70 of FIG. 1 calculates $E = \lambda^2(x - g_x^2) + (y - g_y^2)$ for each pixel in a horizontal column x and a vertical column y, and performs the following tests:

If $E \geq R_{max}^2$ or $E \geq R_{min}^2$, then the pixel $P(x,y)$ does not belong to the contour.

If $R_{min}^2 < E < R_{max}^2$ then the pixel $P(x,y)$ belongs to the contour. At the end of the processing of an image, a set of pixels forming the contour is determined.

The contour can then be overlaid by the overlay circuit 80, either in the source image $X_{i,j}^t$, or in the speckle-filtered image $F_{i,j}^t$, with a specific colour attribute being assigned to the pixels defined as belonging to the contour. This overlay is done as indicated above in the signal delayed by two images, $2T_i$ being the time needed for processing.

The invention is not limited to the image generating method and device especially described above. In particular, the method has been described in relation to heart images by way of illustration, but it can be applied to other types of images resulting from echographical analysis, especially for the formation of optical images of organs which pose similar problems as regards speckle and fuzzy contours. For each type of analysis, a model of the contour must be made and its significant parameters must be pre-determined in an initial stage, the adjustment of these parameters being done by tests during processing. The search for the zero density zone is, of course, adapted to the model and can be done, for example, in a rectangular zone or a zone of any other suitable geometrical shape.

I claim:

1. Method for generating images from source ultrasonic signals obtained by echography, wherein the echos signal is sampled and digitalized to form a succession of samples $x_{i,j}^t$ as a echographical signal with a coded digital value of luminance X at an instant t, identified in the image by the row i of the horizontal column and the row j of the vertical column to which they belong, wherein said echographical signal is automatically processed to superimpose, on the image, a contour of the analyzed organ by the following steps:

reducing the speckle present in said echographical signal through filtration by generating a prediction divergence signal which yields useful data by taking the difference between the digitalized signal $x_{i,j}^t$ and a prediction signal calculated from a model of speckle, this step of reducing further providing a filtered digital signal $F_{i,j}^t$ and a binary signal $B_{i,j}^t$ deduced from the filtered signal produced by said filtration, at state 0 for the points of the filtered signal that have zero luminance and at state 1 for the other points;

processing said binary signal to extract from it the data corresponding to echos recognized as being non-characteristic of the contour, and outputting a signal $I_{i,j}^t$;

processing said signal $I_{i,j}^t$ by bridging to minimize discontinuities by eliminating isolated pixels, and outputting a bridged signal $\tilde{I}_{i,j}^t$;

processing said bridged signal $\tilde{I}_{i,j}^t$ to extract from it the characteristics parameters that can be used in a model of the contour of the organ examined, on the basis of a zone of maximum area, called a zero density zone, which comprises only zeros and corresponds to the interior of the organ analyzed;

calculating the pixels of the contour on the basis of said extracted characteristic parameters and the equation of the model of the organ;

replacing the digital signal, before filtration or when it is filtered, by an overlay signal for all the pixels of the contour;

displaying the result of said step of replacing the digital signal by said overlay signal.

2. Method according to the claim 1 wherein, for the processing of signals obtained by cardiac echography, in which echos are significant of the position of the mitre valve and non-characteristic of the cardiac contour, the processing of the binary signal in the second stage consists in performing the logic AND operation between two binary signals $B_{i,j}^t$ and the same signal q images before $B_{i,j}^{t-qTi}$ these two signals corresponding to the farthest positions of the mitre valve in semi-periodical movement substantially equal to $qT_i$, the entire value of a q being readjusted, if necessary, according to the cardiac rhythm.

3. Method according to claim 1 wherein the signal $I_{i,j}^t$ is bridged by eliminating the isolated pixels at logic level 0, isolated in the sense that they are non-contiguous along a distance equal at least L pixels.

4. Method according to claim 1 wherein the speckle is considered to be a circular noise, the noise model used for generating the prediction signal from the neighbouring samples being a one-dimensional self-regressive model, the order and the coefficients of which are pre-determined by a preliminary learning of the statistical properties of noise in a sequence of images used as a reference.

5. Method according to the claim 4 wherein the preliminary learning of the properties of the noise is done by measuring its mean value, its variance and its self-correlation function on the basis of which the order and coefficients of the noise model will be fixed.

6. Method according to the claim 4 wherein for the processing of signals obtained by cardiac echography, the statistical properties of a noise in a sequence of reference images are estimated in a zone corresponding to the interior of a ventricle where the graininess of the image is likened to the speckle.

7. Method according to the claim 1 wherein, in the fourth stage, the search for the zero density zone with the maximum area is obtained by successive reductions of a zone with a simple geometrical shape, definitely including the image of the analyzed organ, until the density measured in the reduced zone is zero, the geometrical shape selected being capable of being registered in the contour model of the analyzed organ, this zero density zone being characterized by a position vector P at each image.

8. Method according to the claim 7 wherein, for the processing of signals obtained by cardiac echography, the model of the contour is an ellipse and the geometrical shape chosen is a square, the successive reductions being obtained by a reduction of the side of the square at each stage in the search.

9. Method according to the claim 8 wherein, at each stage of the search, the preceding square is subdivided into four squares of the same dimension, reduced in relation to the dimension of the preceding square, these squares partly overlapping one another, the square with the minimum density being selected for the following stage.

10. Method according to any one of the claims 7 to 9 wherein the position vector P is corrected if necessary on the basis of the position vector associated with the preceding image $P^{t-Ti}$ where $T_i$ is the image period, to ensure a sequential follow-up of the contour, the resultant vector being a vector $\hat{P}$.

11. Method according to the claim 10 wherein the parameters in the contour model, deduced from the coordinates of the vector corrected according to the coordinates of the vertices of the zero density square zone, $\hat{P}(xHD\ 1, x_n, Y_1, Y_n)$, are on the one hand, the center of this zone with coordinates $$g_x = \frac{x_1 + x_n}{2} \text{ and } g_y = \frac{y_1 + y_n}{2},$$

on the other hand, two radii $$R_{min} = \frac{(y_n - y_1 - 1)^2}{2}$$

and $$R_{max} = \frac{(y_n - y_1 + 1)^2}{2}$$

and $\lambda$ a parameter for adjusting the ellipse such that $$\lambda = \frac{y_n - y_1}{x_n - x_1} \lambda_{min},$$

$\lambda_{min}$ being a predetermined value of less than 1, the contour being likened to an ellipse defined by all the pixels with coordinates x and y such that:

$$R_{min}^2 < \lambda^2 (x - g_x)^2 + (y - g_y)^2 < R_{max}^2.$$

12. Device for generating images, using ultrasonic signals obtained by echography, comprising:
a memory input circuit a sequence of digitalized samples $X_{i,j}^t$;

a speckle filtering circuit connected to said memory input circuit and providing an initial output to give a filtered digital signal of the speckle $F_{i,j}^t$, and a second output to give an associated binary signal that has the logic 0 level for those points with a filtered value of zero and the logic 1 level for all the other points, a processing channel comprising, in series, a circuit for extracting data corresponding to echos not characteristic of the contour linked to the second output of the filtering circuit, bridging circuit to eliminate pixels detected as being isolated, a circuit for extracting the parameters of the contour and a circuit to calculate the contour, a single direct channel comprising a change-over switch, the inputs of which are linked to the output of the input circuit and to the first output of the filtering circuit, and the output of which transmits, to a delaying circuit, either the succession of digitalized samples $X_{i,j}^t$ or the filtered sequence $F_{i,j}^t$, wherein the output of the direct channel after the delaying circuit and the output of the processing channel after the contour-calculating circuit is linked to the inputs of a circuit for overlaying the contour on the image, the output of this overlaying circuit being connected to a visual display screen.

13. Device according to the claim 12 wherein the filtering circuit comprises:
a predictor circuit to calculate a prediction value $\tilde{X}_{i,j}^t$ on the basis of the preceding samples $X_{i,j}^t$ and a noise model followed by the predictor,
a calculation circuit to calculate a prediction divergence $e_{i,j}^t$ between the prediction value $\tilde{X}_{i,j}^t$ and the real value $X_{i,j}^t$,
a multiplier circuit to multiply by $k_2$ to perform the operation $k_2 e_{i,j}^t$,
two comparison circuits connected to said multiplier circuit, the first comparison circuit limiting the signal $k_2 e_{i,j}^t$ to the maximum range and giving the filtered signal $F_{i,j}^t$, and the second comparison circuit giving the binary signal $B_{i,j}^t$ at level 0 for $k_2 e_{i,j}^t \leq 0$ and at level 1 for $k_2 e_{i,j}^t > 0$.

14. Device according to claim 12 wherein the contour parameters extracting circuit comprises the following elements connected in series:
a set of memories,
a density calculating circuit indexed by a zone position memory circuit through a change-over switch transmitting the pre-determined position of an initial zone,
and a circuit to calculate the parameters of the contour.

* * * * *